United States Patent [19]

Park et al.

[11] Patent Number: 5,259,988

[45] Date of Patent: Nov. 9, 1993

[54] POLYCYANAMIDE COMPOUNDS GENERATING PHOTOELECTRIC CURRENT AND PROCESS FOR THEIR PREPARATION

[75] Inventors: Sang W. Park, Seoul; Kyung H. Yoo, Kyungki; Yong K. Kang, Seoul; Young H. Lee, Seoul; Hyung Y. Kim, Seoul; Hyon T. Kwak, Seoul; Yeong I. Lee, Seoul, all of Rep. of Korea

[73] Assignee: Korea Institute of Science and Technology, Seoul, Rep. of Korea

[21] Appl. No.: 985,204

[22] Filed: Dec. 3, 1992

[30] Foreign Application Priority Data

Dec. 4, 1991 [KR] Rep. of Korea ............... 22162/1991

[51] Int. Cl.$^5$ ............................................. H01B 1/00
[52] U.S. Cl. ........................................ 252/500; 525/540; 534/594; 546/36; 430/56; 430/83; 430/154
[58] Field of Search .................... 252/500; 525/540; 534/594; 546/36; 430/56, 83, 154

[56] References Cited

U.S. PATENT DOCUMENTS 4,167,422  9/1979  Bellanca et al. .................. 525/540

FOREIGN PATENT DOCUMENTS 1163674  2/1964  Fed. Rep. of Germany .

OTHER PUBLICATIONS

Izv. Akad Nauk SSSR, Ser. Khim., 1969 (5) pp. 1086-1089 (Russ.).

*Primary Examiner*—Paul Lieberman
*Assistant Examiner*—M. Kopac
*Attorney, Agent, or Firm*—Birch, Stewart Kolasch & Birch

[57] ABSTRACT

A polycyanamide compound represented by the general formula (I):

$$\{C(A)=N-C(OH)=N\}_x \quad (II)$$

wherein A is $(CH_3CH_2)_2N-\text{Ph}-N=N-\text{Ph}(COOH)-$ or $NaO_3S-\text{Ph}(CH_3)-N=N-\text{Naph}(OH)-$ or $-\text{Naph}(OH)-N=N-\text{Naph}-SO_3Na$ or a tricyclic diketo-diamino structure and X is an integer ranging from 10 to 30.

This polycyanamide compound of the formula (I) is a photoelectric material and, in this respect, can be used for photovoltaic cells, macromolecular cells and functional elements such as photo sensors.

8 Claims, No Drawings

POLYCYANAMIDE COMPOUNDS GENERATING PHOTOELECTRIC CURRENT AND PROCESS FOR THEIR PREPARATION

BACKGROUND OF THE INVENTION

1. Field of the Invention

The present invention relates to polycyanamide compounds generating photoelectric current and represented by the formula (I) and a process for their preparation. The polycyanamide compounds represented by the formula (I) are novel compounds which have not been disclosed in literature and a process for their preparation is not known at all. These novel compounds of the formula (I) are photoelectric materials and, in this respect, can be used for photovoltaic cells, macromolecular cells (storage batteries) and functional elements such as photo sensors.

wherein
A is

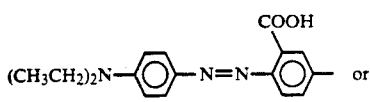

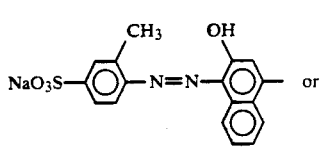

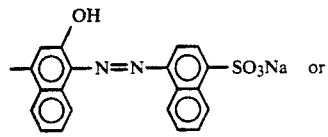

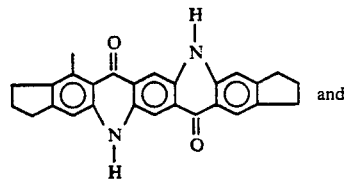

X is an integer ranging from 10 to 30.

2. Description of the Prior Art

A known method for condensing electricity using macromolecular compounds of polycyanamides was disclosed in 1969 [referred to Izv. Akad. Nauvk SSSR, Ser Khim., 1969, (5) 1086–1089 (Russ)]. German Patent No. GE. 1,163,674 discloses use of a compound of cyanamide and dicyanamideformaldehyde as an adhesive for photoconductive materials. However, there has not been proposed preparation of photoelectric materials by diazotization of the polycyanamides and coupling of the diazotate obtained by the diazotization to a visible ray absorbing material.

SUMMARY OF THE INVENTION

It is, therefore, an object of the present invention to provide polycyanamide compounds which are novel photoelectric materials and a process for preparation of such polycyanamide compounds by coupling of an organic dye capable of easily absorbing visible rays to an organic macromolecular semiconducting material showing electrical conductivity.

DESCRIPTION OF THE INVENTION

The present invention provides a polycyanamide compound which is capable of generating photoelectric current and represented by the general structural formula (I).

In addition, the present invention provides a process for preparation of the polycyanamide compound of the formula (I) in which a polycyanamide having the structural formula (II) is diazotizated by strong sulfuric acid in order to obtain a polycyanamide diazotate which is in turn coupled to ethyl red having the formula (IIIa), acid orange 8 having the formula (IIIb), acid red 88 having the formula (IIIc) or K₁ having the formula (IIId).

wherein n is a number more than 100.

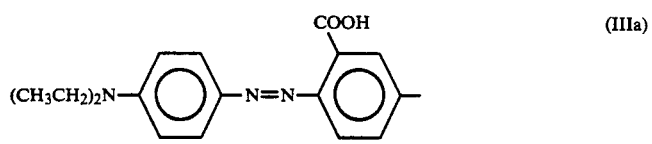

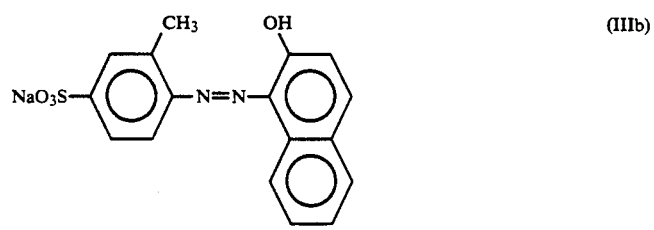

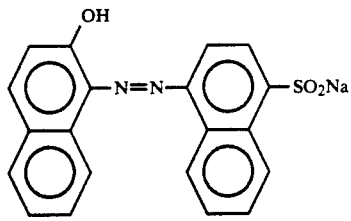
(IIIc)

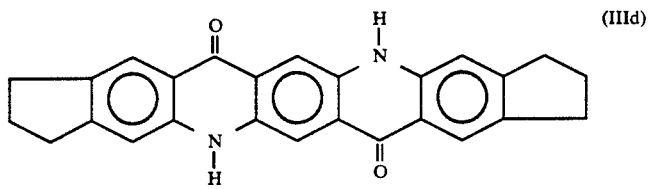
(IIId)

Hereinafter, the present invention will be described in detail.

The present polycyanamide compound, a kind of photoelectric material, having the structural formula (I) is prepared using an electric conductive polycyanamide and dye compounds which absorb visible rays and generate photoelectric current. Meanwhile, the conductive polycyanamide which is used for preparation of the polycyanamide compound of this invention and represented by the structural formula (II) can be prepared using melamine formaldehyde resin represented by the general formula (IV) as disclosed in a known literature [Organic Polymeric Semiconductors, John Willy & Sons, N.Y. (1974)].

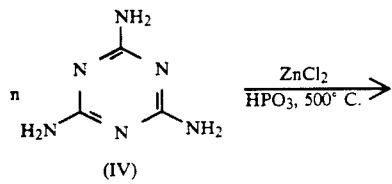
(IV)

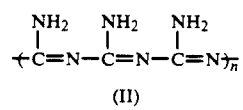
(II)

On the other hand, the dye compounds used in the present invention are selected from the ethyl red of the formula (IIIa), the acid orange 8 of the formula (IIIb), the acid red 88 of the formula (IIIc) and the $K_1$ of the formula (IIId). Here, the polycyanamide compound prepared in accordance with this invention is differently named depending upon the used dye compound. Otherwise stated, the polycyanamide compound prepared using the ethyl red is named as polycyanamide-ethyl red represented by the formula (Ia), in similar manner, use of the acid orange 8 results in polycyanamide-acid orange 8 represented by the formula (Ib), use of the acid red 88 results in polycyanamide-acid red 88 represented by the formula (Ic) and use of the $K_1$ results in polycyanamide-$K_1$ represented by the formula (Id).

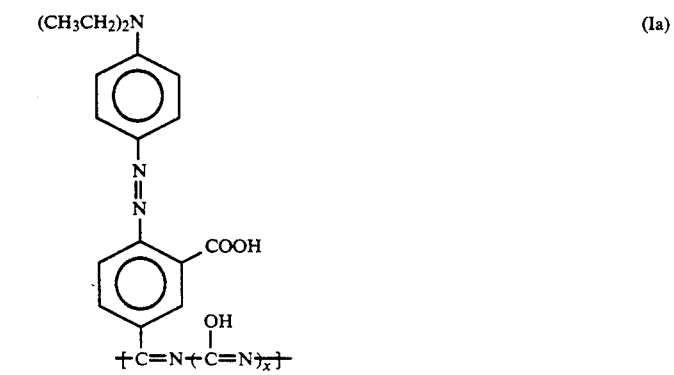
(Ia)

(POLYCYANAMIDE-ETHYLRED)

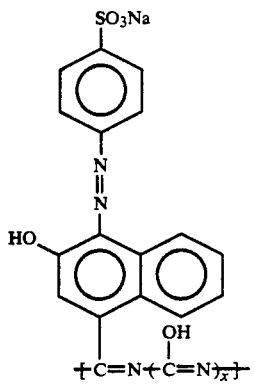

(POLYCYANAMIDE-ACID ORANGE 8)    (Ib)

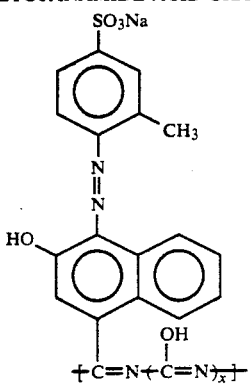

(POLYCYANAMIDE-ACID RED 88)    (Ic)

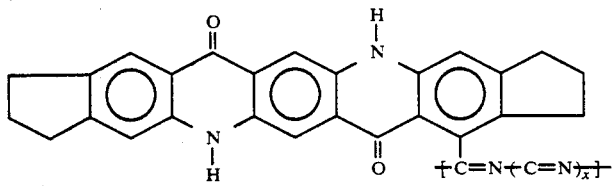

(POLYCYANAMIDE-K₁)    (Id)

wherein X is an integer ranging from 10 to 30.

In order to prepare the polycyanamide compound of the formula (I) according to this invention, the polycyanamide having the formula (II) is dissolved in a strong sulfuric acid, and thereafter, reacted with sodium nitrite at the temperature of 0° C. in order to be diazotizated. Thereafter, the diazotate is mixed with the ethyl red of the formula (IIIa), the acid orange 8 of the formula (IIIb), the acid red 88 of the formula (IIIc) or the K₁ of the formula (IIId), each added to the diazotate in the form of a solution dissolved in strong sulfuric acid. In result, the polycyanamide compound of the general formula (I) is prepared.

The resulted polycyanamide compound having the general formula (I) of this invention generates the photoelectric current upon radiation of the visible rays and shows excellent electric conductivity and, in this respect, is efficiently used for photoelectric materials.

The aforementioned reaction process for preparation of the polycyanamide compound of the general formula (I) of this invention can be represented by the following sequential reaction formula.

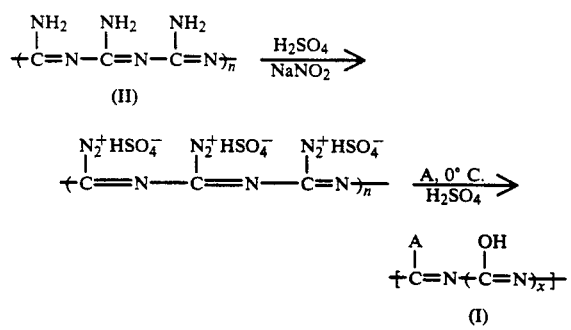

In the resulted polycyanamide compound of the general formula (I) prepared by the aforementioned process, electronic transition of the electrons of the dye molecule of the result compound occurs when the result compound absorbs energy of the visible rays, in result, there occurs the $\pi \rightarrow \pi^*$ electronic spectrum of the electrons. Thereafter, the vibrationally and rotationally transited electrons are transferred through the conjugated double bond of the conductive polycyanamide chain.

In accordance, when the polycyanamide compound of the general formula (I) of this invention is connected to a system for permitting the electrons vibrationally and rotationally transited due to the absorption of visible ray energy to be transferred to one direction, it is possible to broadly use the polycyanamide compound of this invention as a material of photoelectric cell efficiently used in various industrial fields.

In addition, doping of the polycyanamide compound of the formula (I) of this invention using bromine improves the electric conductivity of the polycyanamide chain and this causes the effect of the present invention to be more improved.

The following examples and measurement are merely intended to illustrate the present invention in further detail and should by no means be considered to limit the scope of the invention.

EXAMPLE 1

Preparation of Polycyanamide-ethyl Red of the Formula (Ia)

1 g (0.024 mol) of polycyanamide, which had been dried in a vacuum oven (70° C., −100 kpa) for at least 10 hours, was added to 30 ml of strong sulfuric acid (95%) in a beaker and agitated for 24 hours in order to obtain a polyamide compound solution (hereinafter, referred to simply as "the pc solution") which was in turn slowly cooled to 0° C. On the other hand, 15 ml of strong sulfuric acid in another beaker was cooled to 0° C. and mixed with 1.66 g (0.024 mol) of sodium nitrite in order to fully dissolve the sodium nitrite in the sulfuric acid in such a manner that the sodium nitrite was added to the sulfuric acid several times in small amount. Thereafter, this sodium nitrite solution was mixed with the prepared pc solution and, in this respect, there occurred diazotization of the pc solution. At this time, the reaction temperature was maintained to be not higher than 0° C. In addition, 3 g (0.01 mol) of ethyl red was dissolved in 30 ml of strong sulfuric acid contained in still another beaker in order to obtain an ethyl red solution which was in turn slowly dropped, using a dropping pipet, to the diazotizated solution at the temperature of 0° C. The result mixture was agitated at 0° C. for 3 hours and gradually heated to 55° C. at which temperature the mixture was additionally agitated for 3 hours. As a result, bubbling according to temperature rising was observed with the naked eye and the generated gas was judged as nitrogen gas. This reaction mixture was diluted by 3 L of distilled water in order to form precipitate and filtered by a glass filter and continuously washed by distilled water until the filtrate was neutralized.

Thereafter, the neutralized filtrate was dried in an oven at the temperature of 70° C. for at least 10 hours and extracted, using methanol as a solvent, using Soxhlet extractor in order to extract unreacted ethyl red from the filtrate until the ethyl red was no longer contained in the extract. The remainder from the extraction was then fully dried by the vacuum oven (70° C., −100 kpa) in order to provide result powder which was in turn dissolved in 25 ml of dimethylformaldehyde. Unsolved polycyanamide was, thereafter, separated from the solution. The solution of the polycyanamide in the dimethylformaldehyde was added to 200 ml of distilled water in order to form precipitate, filtered and dried. In result, 0.2 g of reaction product was obtained. The infrared spectrum of the reaction product was represented as follows:

IR(KBr): 3400(—OH), 1690(C=O) and 1650(C=N)cm$^{-1}$

EXAMPLE 2

Preparation of Polycyanamide-acid orange 8 of the formula (Ib)

1 g (0.024 mol) of polycyanamide, which had been dried in a vacuum oven (60° C., −100 kpa), was dissolved in 30 ml of strong sulfuric acid (95%) in a beaker and agitated for 24 hours in order to obtain a polyamide compound solution (pc solution) which was in turn slowly cooled to 0° C. On the other hand, 15 ml of strong sulfuric acid in another beaker was cooled to 0° C. and mixed with 1.66 g (0.024 mol) of sodium nitrite in order to obtain sodium nitrite solution. Thereafter, this sodium nitrite solution was mixed with the prepared pc solution at 0° C. in such a manner that the sodium nitrite solution was added to the pc solution several times in small amount and, in this respect, there occurred diazotization of the pc solution. In addition, 4.4 g (0.012 mol) of acid orange 8 was dissolved in 30 ml of strong sulfuric acid contained in still another beaker in order to obtain an acid orange 8 solution which was in turn cooled to a temperature not higher than 0° C. This acid orange 8 solution was, thereafter, slowly dropped, using a dropping pipet, to the diazotizated solution at the temperature of 0° C. The result solution was agitated at 0° C. for 30 minutes and gently heated to 50° C. at which temperature the solution was additionally agitated for 3 hours. As a result, bubbling according to decomposition of —N=N— coupling was observed with the naked eye. This result solution was diluted by 3 L of distilled water in order to form precipitate and filtered by a glass filter and continuously washed by distilled water until the filtrate was neutralized.

Thereafter, the neutralized filtrate was dried in an oven at the temperature of 70° C. for at least 10 hours and extracted using Soxhlet extractor in order to extract unreacted acid orange 8 from the filtrate. At this time, the extraction of the filtrate used methanol as a solvent, and was continued until the remainder became colorless. The remainder from the extraction was then fully dried by the vacuum oven (70° C.) for at least 10 hours. The result compound was no longer separated by the solvents except for the strong sulfuric acid so that the result compound was not separated and 0.7 g of reaction product was obtained. The infrared spectrum of this reaction product was represented as follows:

IR(KBr)(cm$^{-1}$): 3400(—OH), 1620(—C=N)

EXAMPLE 3

Preparation of Polycyanamide-acid red 88 of the formula (Ic)

1 g (0.024 mol) of polycyanamide, which had been dried in a vacuum oven (60° C., −100 kpa), was added to 30 ml of strong sulfuric acid in a beaker and agitated for 24 hours in order to obtain a polyamide compound solution (pc solution) which was in turn gently cooled to 0° C. On the other hand, 15 ml of strong sulfuric acid in another beaker was slowly mixed with 1.66 g (0.024 mol) of sodium nitrite in order to obtain sodium nitrite solution. Thereafter, this sodium nitrite solution was mixed with the prepared pc solution in such a manner that the sodium nitrite solution was added to the pc solution several times in small amount and, in this respect, there occurred diazotization of the pc solution. At this time, the reaction temperature was maintained at a temperature not higher than 0° C.

In addition, 4.8 g (0.012 mol) of acid red 88 was dissolved in 30 ml of strong sulfuric acid contained in still another beaker in order to obtain an acid red 88 solution which was in turn cooled to a temperature not higher than 0° C. This acid red 88 solution was, thereafter, slowly dropped, using a dropping pipet, to the diazotizated solution at the temperature of 0° C.

The reaction mixture was then slowly heated to 50° C. and agitated for 4 hours. When the reaction temperature reached 18° C., bubbling was observed with the naked eye. This result mixture was diluted by 3 L of distilled water in order to form precipitate and filtered by a glass filter and continuously washed by distilled water until the filtrate was neutralized. thereafter, the neutralized filtrate was dried in an oven at the temperature of 70° C. for at least 10 hours and extracted using Soxhlet extractor in order to extract unreacted acid red 88 from the filtrate. At this time, the extraction of the filtrate used methanol, a kind of solvent, and was continued until the remainder became colorless. The remainder from the extraction was then fully dried by the vacuum oven (70° C.) for at least 10 hours. The result compound was no longer separated by the solvents except for the strong sulfuric acid so that the result compound was not separated. In result, 0.5 g of reaction product was obtained. The infrared spectrum of the reaction product was represented as follows:

IR(KBr): 3400(—OH), 1650(—C≡N)cm$^{-1}$

EXAMPLE 4

Preparation of Polycyanamide-K$_1$ of the Formula (Id)

1 g (0.024 mol) of polycyanamide, which had been dried in a vacuum oven (60° C., −100 kpa), was added to 30 ml of strong sulfuric acid in a beaker and agitated for 24 hours in order to obtain a polyamide compound solution (pc solution) which was in turn maintained at a temperature not higher than 0° C. On the other hand, 15 ml of strong sulfuric acid in another beaker was cooled to 0° C. and mixed with 1.66 g (0.024 mol) of sodium nitrite in order to obtain sodium nitrite solution. Thereafter, this sodium nitrite solution was mixed with the prepared pc solution at 0° C. in such a manner that the sodium nitrite solution was added to the pc solution several times in small amount and, in this respect, there occurred diazotization of the pc solution.

In addition, 1.50 g (0.004 mol) of K$_1$ was dissolved in 30 ml of strong sulfuric acid contained in still another beaker in order to obtain a K$_1$ solution which was in turn cooled to 0° C. This K$_1$ solution was, thereafter, slowly dropped, using a dropping pipet, to the diazotizated solution at the temperature of 0° C.

The result solution was agitated at 0° C. for 1 hour and gently heated to 50° C. at which temperature the solution was additionally agitated for 3 hours. As a result, bubbling according to decomposition of —N≡N— coupling was observed with the naked eye. This result solution was diluted by 3 L of distilled water in order to form precipitate and filtered by a glass filter and continuously washed by distilled water until the filtrate was neutralized.

Thereafter, the neutralized filtrate was dried in an oven at the temperature of 70° C. for at least 24 hours and extracted using Soxhlet extractor in order to extract unreacted K$_1$ from the filtrate. At this time, the extraction of the filtrate used methanol, a kind of solvent, and was continued until the remainder became colorless.

The remainder from the extraction was then fully dried by the vacuum oven (70° C.) for at least 24 hours. The result compound was no longer separated by the solvents except for the strong sulfuric acid so that the result compound was not separated and 0.65 g of reaction product was obtained. The infrared spectrum of this reaction product was represented as follows:

IR(KBr): 3400(—NH, OH), 1690(C=O) and 1600(—C≡N)cm$^{-1}$

MEASUREMENT OF ELECTRIC CONDUCTIVITY

In order to measure electric conductivity of each of the result polycyanamide compounds respectively prepared in accordance with the above Examples 1 to 4 and having the formulas (Ia) to (Id), disc samples of 0.2–0.4 mm were prepared, using an infrared pellet system, from the result polycyanamide compounds and measured in their voltages using 4-point probe technique. Thereafter, the electric conductivity of each of the polycyanamide compound disc samples was calculated, using the measured voltage, in accordance with the following equation.

$$C = \tfrac{1}{2}\pi S \times A/V$$

wherein
C is the electric conductivity ($\Omega^{-1} \cdot cm^{-1}$);
S is a probe interval;
A is a current applied to the disc sample of the polycyanamide compound; and
V is the measured voltage.

The measurement of the electric conductivity was repeatedly carried out for the samples before doping and after the doping of bromine simultaneously with radiation of visible rays toward the samples by means of 30 W bulb for the samples before doping but 100 W bulb for the samples after doping of the bromine.

At this time, the distance between the bulb and the sample to be measured was 15 cm and the radiation time of the visible rays was 30 minutes. The measured electric conductivities are given in Table 1.

TABLE 1

| | (Electric Conductivities) | | | |
| | Doping Before | Doping After ($\Omega^{-1}$, cm$^{-1}$) | | |
| Compounds | ($\Omega^{-1}$, cm$^{-1}$) | Without Beam | 30W Beam | 100W Beam |
| --- | --- | --- | --- | --- |
| Polycyanamide | $3.5 \times 10^{-11}$ | $6.2 \times 10^{-4} \sim 4.5 \times 10^{-3}$ | | |
| Polycyanamide-Ethyl red | $4.7 \times 10^{-12}$ | $7.8 \times 10^{-3}$ | $6.6 \times 10^{-4}$ | $2.0 \times 10^{-3}$ |
| Polycyanamide-Acid orange 8 | $5.1 \times 10^{-11}$ | $8.8 \times 10^{-3}$ | $6.4 \times 10^{-2}$ | $3.6 \times 10^{-1}$ |
| Polycyanamide-Acid red 88 | $1.4 \times 10^{-11}$ | $5.3 \times 10^{-4}$ | $3.7 \times 10^{-3}$ | $9.9 \times 10^{-2}$ |
| Polycyanamide-K$_1$ | $3.4 \times 10^{-9}$ | $3.7 \times 10^{-6}$ | $1.8 \times 10^{-5}$ | $2.2 \times 10^{-4}$ |

What is claimed is:

1. A polycyanamide compound represented by the general formula (I):

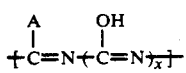

wherein
A is

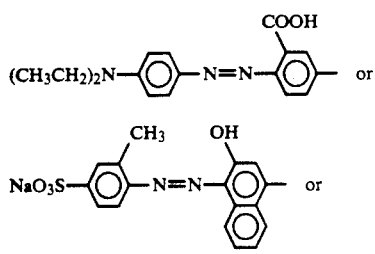

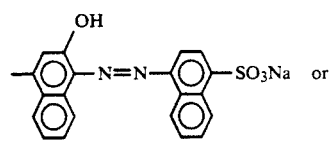

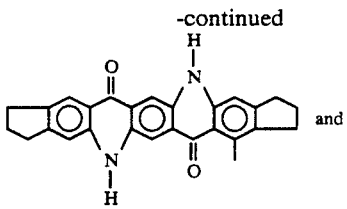

X is an integer ranging from 10 to 30.

2. A process for preparation of a polycyanamide compound represented by the general formula (I) as claimed in claim 1 which comprises the steps of:

diazotizating a polycyanamide represented by the formula (II) in strong sulfuric acid in order to obtain a polycyanamide diazotate; and coupling said polycyanamide diazotate to ethyl red represented by the formula (IIIa), acid orange 8 represented by the formula (IIIb), acid red 88 represented by the formula (IIIc) or $K_1$ represented by the formula (IIId)

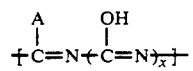 (I)

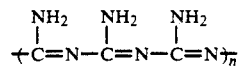 (II)

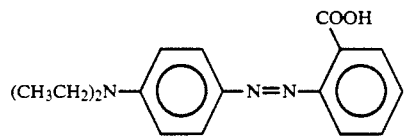 (IIIa)

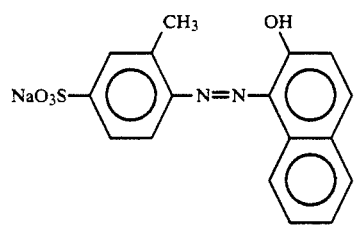 (IIIb)

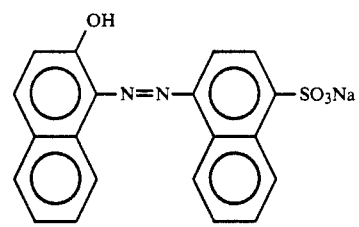 (IIIc)

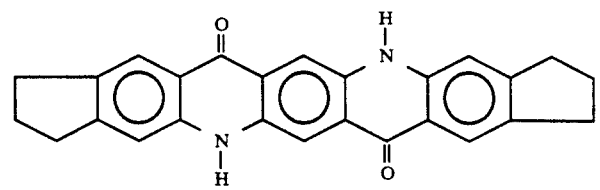 (IIId)

wherein
A of the formula (I) is

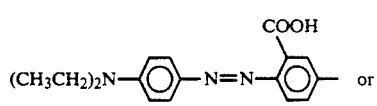

-continued

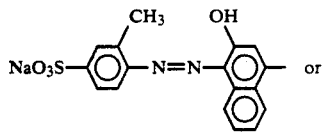 or

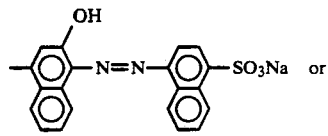 or

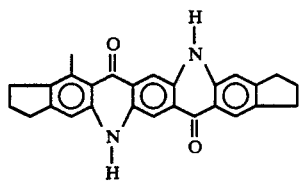

X is an integer ranging from 10 to 30; and
n of the formula (II) is 100 or more.

3. A process for improving the electric conductivity of the polycyanamide compound represented which comprises formula(I) by doping the same using bromine.

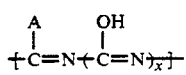 (II)

wherein
A is

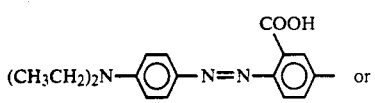 or

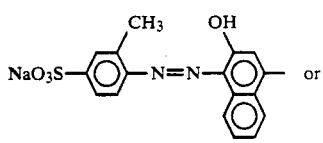 or

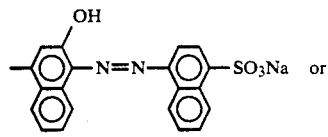 or

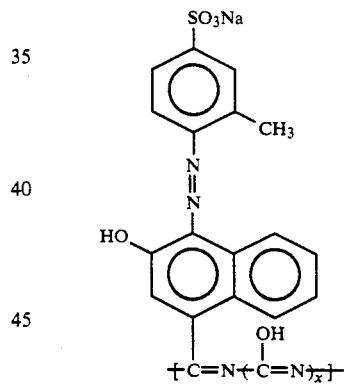 and

X is an integer ranging from 10 to 30.

4. The compound according to claim 1, wherein said compound is represented by the formula:

$$+C=N+C=N\}_x+$$

wherein x is an integer ranging from 10 to 30.

5. The compound according to claim 1, wherein said compound is represented by the formula:

$$+C=N+C=N\}_x+$$

wherein x is an integer ranging from 10 to 30.

6. The compound according to claim 1, wherein said compound is represented by the formula:

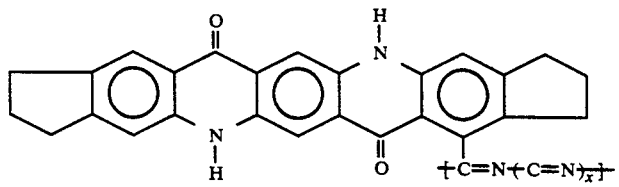

wherein x is an integer ranging from 10 to 30.

7. A composition, comprising a compound as claimed in claim 1 and a bromine dopant.

8. The process according to claim 2, wherein said diazotizating step comprises reacting said compound of formula (II) with sodium nitrite at 0° C.

* * * * *